METHOD OF MAKING PRINTED CIRCUIT BOARDS

Filed Aug. 31, 1970

INVENTOR
Leo Fiderer

By Smyth, Roston & Pavitt

ATTORNEYS

METHOD OF MAKING PRINTED CIRCUIT BOARDS

Filed Aug. 31, 1970

INVENTOR
Leo Fiderer
By Smyth, Roston & Pavitt
ATTORNEYS

METHOD OF MAKING PRINTED CIRCUIT BOARDS

Filed Aug. 31, 1970 4 Sheets-Sheet 3

INVENTOR
Leo Fiderer
By Smyth, Roston & Pavitt
ATTORNEYS

INVENTOR
Leo Fiderer
By Smyth, Roston & Pavitt
ATTORNEYS

United States Patent Office 3,740,225

Patented June 19, 1973

3,740,225
METHOD OF MAKING PRINTED CIRCUIT BOARDS

Leo Fiderer, 5640 Aldea Ave., Encino, Calif. 91316

Filed Aug. 31, 1970, Ser. No. 68,175
Int. Cl. G03c 5/04
U.S. Cl. 96—43 5 Claims

ABSTRACT OF THE DISCLOSURE

A perforated control tape is provided having a pattern of holes related to the pattern of elements of the desired printed circuit pattern. The holes in the tape control the markings on a photosensitive film strip such that the markings on the film produce the lines and shapes of a segment of the desired photomaster for a printed circuit. After development, as many film strips as required to produce the complete photomaster are assembled on a backing to form a composite corresponding to the image of the desired photomaster. A final photomaster for the printed circuit board is then made from the film strips assembled on the backing.

This invention relates in general to a method of making printed circuit boards and more particularly to an improved method for providng a photomaster for the making of printed circuit boards.

Due to the increase in the technology and the manufacturing of microelectronics within the past few years, microelectronics, such as integrated circuits and hybrid circuits, are used in almost every type of electronic equipment today. For example, microelectronics are used in digital computers, communications, equipment, servocontrol devices, radios, televisions, and similar electronic devices. Microelectronic devices are used because of their compactness and high density of interconnection capabilities.

Microelectronics such as integrated circuits and hybrid circuits are mounted in a printed circuit board having a plurality of pads located at particular predetermined locations on an insulating board. A plurality of printed wires or conductor paths interconnect the various pads. The pads are usually circular or rectangular areas of copper located on the insualting board. The pads provide conductive areas from which the leads of the microelectronic devices can be connected to the printed circuit board and also provide a conductive area for the interconnection of the conductor paths. The conductor paths on a printed circuit board are narrow strips or paths of copper on the surface of the insulating board.

Since the conductor paths on the printed circuit board are usually printed on one side of the insulating board, if it is necessary, due to circuit requirements, to cross conductive paths it may be necessary to externally connect wires on the opposite side of the insulating board to interconnect pads. However, one way of eliminating the need for external wiring is by using a multi-layer circuit board in which several layers of printed circuit boards are laminated together and interconnected at the pads with plated-through holes.

Whether single or multi-layer printed circuit boards are used, the process for making the individual printed circuit boards is substantially the same. The making of a printed circuit board includes basically a two-step process. The first step in the process of making a printed circuit board is to produce necessary art work or a photomaster in the form of a negative having pads and interconnecting conductor paths developed thereon. The second step in the making of a printed circuit board is to expose an insulating material having a copper layer thereon that has been previously coated with a photosensitive material to light after the photomaster has been placed in the conductive copper surface. After the copper surface on the insulating board has been exposed to light such as ultraviolet light, the insulating board is dipped or submerged into an appropriate acid to remove all of the copper on the surface of the insulating board except those portions corresponding to the positive portion of the photomaster or those portions that the light was allowed to pass through the photomaster.

The production of a photomaster has been done by various manual and automated methods. In one method of providing the photomaster manually of the prior art, a drafstman or engineering designer converts a schematic or logic diagram to a master layout drawing on a large grid sheet. The master layout is made by first locating the position of each of the required pads on the grid sheet and interconnecting the pads with pencil lines. For example, the draftsman marks the location of the various pads at the intersection of grid lines and interconnects the pads with pencil by marking along the grid lines from pad to pad.

For multi-layer printed circuit boards, a grid sheet is made for each layer. Often a drafstman will use different colored pencils for each layer to aid the draftsman in differentiating between the various layers. From the layout drawing or grid sheet, the draftsman prepares a positive form which a photograph can be taken to provide a photomaster. The positive can be made by placing the layout drawing under a sheet of transparent or translucent material such as Mylar. Adhesive pads in the form of round pieces of black tape are placed on the translucent material at the locations of the pads as located on the grid sheet. Once the pads have been placed into their proper positions, thin strips of black tape are applied to the sheet of translucent material from the pads to be interconnected. Once the positive has been completed by the application of the required pads and interconnections, a photograph is taken to provide a negative. Usually the positive, commonly called artwork, is made from two to four times larger than the required printed circuit and then reduced to a negative of the final size in the photographic process. Consequently a negative is provided that has white or clear translucent areas corresponding to the pads and interconnecting conductor paths and will be black or opaque at all other portions thereof. It should be noted that when the above process is used for making the negative or photomaster for each individual layer of a multilayer printed circuit board, alignment marks are provided on the translucent material to assure proper alignment of the individual positives or layers of translucent material.

Manually preparing a photomaster or negative by the abovedescribed method has many disadvantages. First, the preparation of one positive drawing may require as much time as from eight to sixteen hours of time of a draftsman. This time does not include the time required to plan and to lay out the printed circuit pattern. Furthermore, if a small quantity of printed circuit boards are required having the same printed circuit pattern, the time and expense required to provide the photomaster by taping may not be economically justified and external point-to-point wiring may be used instead of printed wiring.

To eliminate the time and expense required to make a photomaster by the methods described above, automated equipment has been developed. The most common automated equipment used to produce a photomaster is a photo plotter. The photo plotter includes a carriage having a light source mounted on a carriage. The carriage is driven by a pair of precise lead screws in the X and Y coordinate directions. The lead screws in turn are driven by servomotors actuated by electrical signals provided by a computer in response from a numerical control tape, or a set of punched cards, or a magnetic tape. A photosensitive material is positioned under the light source, which is on the carriage of the photo plotter, and, as the light source is moved over the photo-sensitive surface, a beam of light impinges on the photosensitive material. Wherever the beam of light impinges on the photo-sensitive surface, the image of the conductor paths of the desired printed circuit pattern is traced. After development, the exposed photosensitive surface is used as the photomaster for the fabrication of a printed circuit.

Two methods can be used to obtain the stored input to the computer which is used to drive the photo plotter. One method is the use of a computer program, and the other method is the use of a digitizer.

If a computer program is used to operate the computer to drive the photo plotter, the schematic or logic diagram is converted into an appropriate code and either punched on input cards or recorded on a magnetic tape or other source. From the circuit schematic diagram, the computer program determines the layout of the conductor paths on the printed circuit and provides a set of cards or a tape coded for the layout. Various codes have been used by manufacturers. The computer then provides electrical signals necessary to operate the lead screws of the photo plotter in response to the cards or tape.

A digitizer is a device that can be used to convert a grid layout into a numerical control tape or other computer input media. To operate a digitizer an operator aligns a stylus with a first coordinate on the grid sheet corresponding to a pad and then actuates a switch. When the switch is actuated a reference coordinate is established within the digitizer. The operator then traces over the lines on the grid sheet corresponding to the conductor paths to a second coordinate corresponding to a second pad with the stylus in alignment with the second coordinate or second conductor pad and again actuates the switch. Whenever the switch is actuated, the coordinate position of the stylus is monitored by an electro-mechanical encoding system, processed by a computer and furnished as an output to a punched numerical control tape, to a set of punched cards, or to a magnetic tape. The process is completed from various coordinates to other coordinates by tracing over the desired conductor paths for each interconnection between conductor pads as provided by the layout sheet. The numerical control tape or the set of punched cards can then be applied to a computer that generates the electrical signals necessary to drive the lead screws of the photo plotter. Consequently, the conductor paths as provided on a layout sheet are converted to signals for the photo plotter which in turn provides a photomaster.

The method described above of automatically providing a photomaster does eliminate the slow manual taping of the artwork. However, the expense of such a system including a computer is extensive. For example, depending upon the size and the capability of a particular system used, the cost of such a system may vary from $120,000 to $500,000, as presently being produced. Furthermore, such a system requires special facilities, such as an air-conditioned dark room for the photo plotter and various types of peripheral equipment essential to the computer. A computer has to be used twice with this method. First, a computer is needed to translate the information from a digitizer or a coded circuit schematic into a numerical control tape or a set of punched cards. Then the computer is needed again to convert the information from the numerical control tape into the operation of the photoplotter. It is an object of the present invention to create a photomaster for printed circuits from a perforated numerical control tape by a method using an apparatus that is much less expensive than a photo plotter, an apparatus that can be easily transported by hand and operated in any convenient location, an apparatus that does not require the installation of special environmental facilities, an apparatus that can translate information from a perforated numerical control tape into a photomaster for printed circuits without the requirement of a computer and its associated essential peripheral equipment.

In the present invention, a perforated numerical control tape of opaque material is used as the input medium. This tape resembles an ordinary punched tape such as the one used with computers or teletype equipment, with one significant difference. In an ordinary punched control tape, each set of holes in the tape represents a special character, alphabetic, numeric, punctuation or the like, which has to be decoded by special circuitry for subsequent processing by a computer. The punched control tape used in the present invention contains a pattern of holes which form a replica of elements of a printed circuit pattern, such as line segments, pads or special shapes. A portion of the punched tape of a certain length represents a segment of the desired printed circuit pattern.

The opaque punched tape is sequentially driven in steps past a light source and a photosensitive material. The photosensitive material and the opaque punched tape are separated by an optical mask. The mask, which is mounted on a turret to permit a quick changing of masks, has compartments or slots that can be aligned with the holes that have been previously punched in the opaque tape. In each slot, the mask has an opening on the side facing the photosensitive material in the shape of an element of the printed circuit pattern. The photosensitive material is also sequentially driven past the mask in synchronization with the steps of the motion of the punched tape. Consequently, as the opaque punched tape and the photosensitive material are sequentially stepped for each hole in the punched tape that is in alignment with a slot in the mask, a flash of light from the light source passes through the hole in the punched tape and through the slot in the mask and provides an exposed area on the photosensitive material. This exposed area on the photosensitive material conforms to the shape of an element of the printed circuit pattern corresponding to the opening in the slot.

The punched tape and the photosensitive material continue to pass the mask in stepwise motion, while at each step elements of the printed circuit pattern are selectively projected through the mask onto the photosensitive material, depending on the absence or presence of a punched hole over the corresponding slot in the mask, until the combination of the individual elements complete the printed circuit pattern for the particular segment of the desired photomaster. This process is repeated for all the segments of the desired photomaster. The segments of the photosensitive material are then developed and placed on or adhered to a common transparent sheet so that the combination of the segments form the complete image of the desired photomaster. The sheet is then photographed to provide a photomaster for the printed circuit.

The production of a photomaster from a punched tape by the method of the present invention eliminates not only the need for a photo plotter, but also the need of a computer to translate the information from the punched tape, and the associated computer peripheral equipment. Consequently the size required to store the present invention is much smaller than the size of prior art automated techniques. Furthermore, the cost of the apparatus using the present invention is considerably less than the cost of a photo plotter. Also, the making of a photomaster by the present invention can be done in a much shorter period of time than the prior art manual techniques, and at a more economical rate than prior automated techniques.

The above and other objects, features and advantages of the present invention will become more apparent upon reference to the following detailed description taken in conjunction with the accompanying drawings, in which:

For a better understanding of the method used with the present invention the basic principles used in the creation of a printed circuit pattern are explained first.

Figure 1:
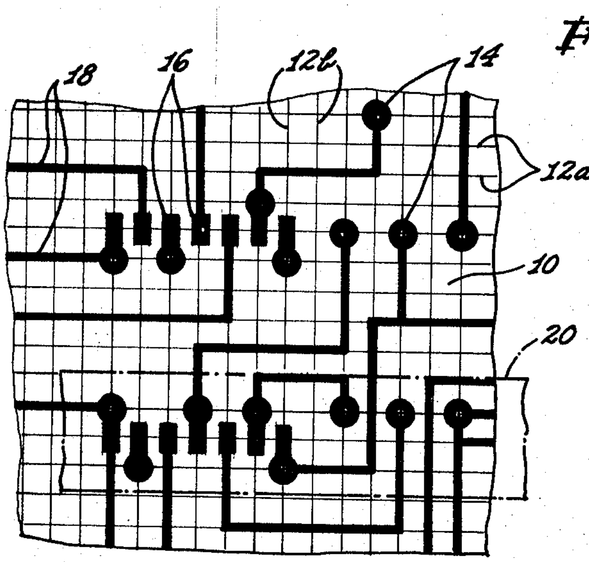
FIG. 1 is a fragment of a printed circuit pattern, superimposed on a system of coordinate grid lines in the X-axis and Y-axis, illustrating the essential elements of printed circuit patterns, such as pads and connecting lines.

Referring now to the drawings, wherein like characters designate like or corresponding parts, there is illustrated in FIG. 1 a fragmentary view of a printed circuit pattern 10, superimposed on a grid which covers the entire area of the printed circuit pattern 10. The grid consists of grid lines **12*a* in the X-coordinate direction and of grid lines 12*b* in the Y-coordinate direction. The printed circuit pattern 10 is composed of basic elements which can be classified into three groups, namely circular pads 14, specially shaped pads 16, and interconnection paths 18. The circular pads 14 indicate the location of holes in the printed circuit for the insertion of a component lead or for the provision of conductor path from one printed circuit layer to the other. The specially shaped pads 16 have a shape governed by the nature of a special component to be attached to the surface or by the shape of a printed circuit connector. The interconnection paths 18 provide electrical conduction between the pads 14 and/or 16**.

In the printed circuit pattern 10, all the centers of pads 14 or 16 are placed on the intersections of grid lines **12*a* and 12*b*. Such a placement conforms with the recommended practice for all printed circuit designs. When this practice is followed, it is possible to provide conduction between all the pads 14 or 16 by placing the interconnection paths along the traces of the grid lines 12*a* and 12*b*. Thus, each portion of a grid line 12*a* or 12*b* between the intersections of two adjacent parallel grid lines can be considered as the possible location of a segment of an interconnection path 18. Therefore, the entire printed circuit pattern can be created by following all the grid lines 12*a* and 12*b* and by selectively placing a segment of an interconnection path 18 between two intersections of grid lines 12*a* and 12*b*, as needed, and by selectively placing a pad 14 or 16 on the intersection of grid lines 12*a* and 12*b*** as needed.

The embodiment of the present invention provides a systematic method of creating the image of a printed circuit pattern 10 by subdividing the entire area of the printed circuit pattern into segments and by creating the elements of the image in successive steps.

Figure 2:
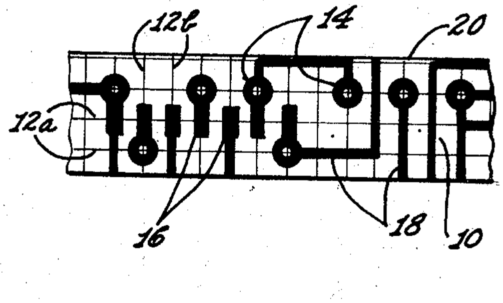
FIG. 2 is a strip segment of the aforesaid printed circuit pattern shown in FIG. 1.

Referring to FIG. 2, there is illustrated a fragmentary view of a strip segment 20 of the printed circuit pattern 10 shown in FIG. 1. In the example shown in FIG. 2, there are four grid lines **12*a* in the X-direction and a larger number of grid lines 12*b* in the Y-direction. The number of the uniformly spaced grid lines 12*b* in a strip segment 20 depends on the total length of the printed circuit pattern 10. In the following explanation of the principle of the systematic creation of the printed circuit pattern 10, the creation of the interconnection paths 18** is described first.

Figure 3A:
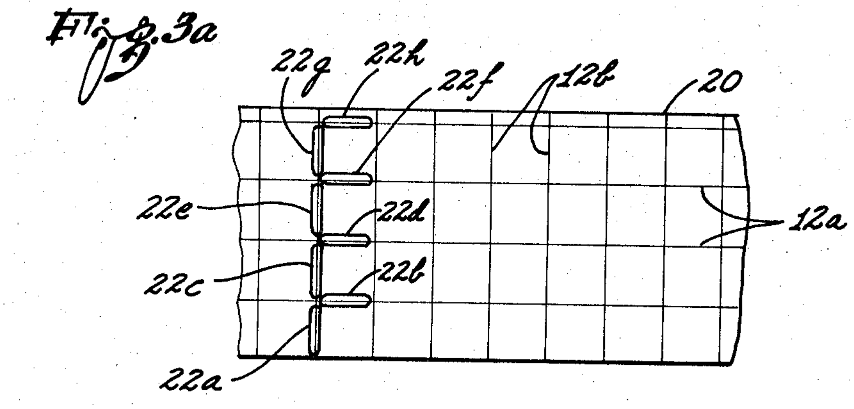
FIG. 3*a* is a blank strip segment with coordinate grid lines to be used as a background for a printed circuit pattern, indicating the relative location of individual line segments which can be used to create a pattern of interconnecting lines that are part of a printed circuit pattern.

Referring now to FIG. 3*a*, there is illustrated a blank strip segment 20 with grid lines **12*a* and 12*b*. Associated with each grid line 12*b*, there are eight short line segments 22*a* through 22*h*. Line segments 22*a*, 22*c*, 22*e*, and 22*g* are superimposed on the grid line 12*b*, while line segments 22*b*, 22*d*, 22*f*, and 22*h* are superimposed on the portions of the grid lines 12*a* between the one grid line 12*b* and the next parallel grid line 12*b*. When passing in steps from one grid line 12*b* to the next grid line 12*b* along the entire length of the strip segment 20, it is possible to create the pattern for all the interconnection paths 18 by assigning at each step one or more of the line segments 22*a* through 22*h* to the circuit pattern 10**.

Figure 4A:
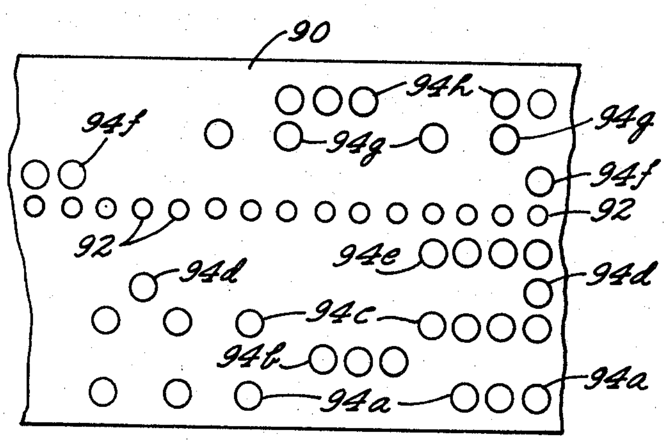
FIG. 4*a* is a fragment of an opaque punched control tape with a pattern of data holes that is the replica of a pattern of line segments.

In the present invention, the stepwise selection of one or more of the line segments **22*a* through 22*h* is effected by the perforated control tape 90**, illustrated in FIG. 4*a*. This punched control tape 90 resembles an ordinary eight channel perforated computer tape with one channel of sprocket holes 92 and eight channels of data holes **94*a* through 94*h*. Unlike the case with an ordinary perforated computer tape, in the control tape 90, used in the present invention, each data hole 94*a* through 94*h* corresponds to one of the line segments 22*a* through 22*h* of the circuit pattern 10**.

Figure 3B:
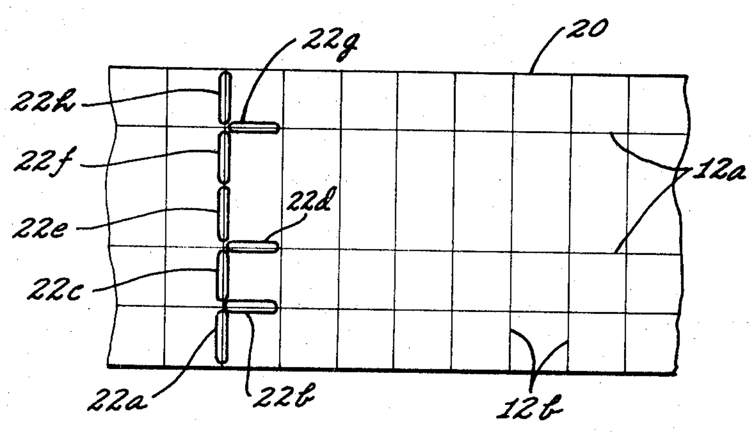
FIG. 3*b* is an alternate form of a blank strip segment, showing an alternate arrangement of coordinate grid lines and an alternate arrangement of line segments.
Figure 4B:
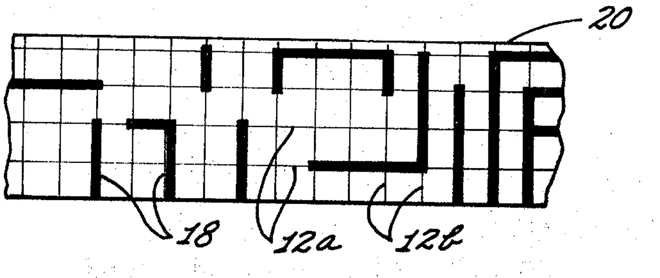
FIG. 4*b* is a strip segment with a pattern of line segments that is the replica of the pattern of data holes in the punched control tape of FIG. 4*a*.

FIG. 4*b* illustrates a fragmentary view of a strip segment 20, containing a pattern of interconnection paths 18. The illustration in FIG. 4*a* shows a portion of the punched control tape 90 that is used to create the pattern of interconnection paths shown in FIG. 4*b*. When the illustrations of FIG. 4*a* are compared with FIGS. 3*a* and 3*b*, the direct correspondence between the line segments **22*a* through 22*h* and the data holes 94*a* through 94*h* becomes apparent. Each position of a sprocket hole 92 in the tape 90 corresponds to the position of a grid line 12*b*. For each data hole 94*a* in the tape, there is a corresponding line segment 22*a*; for each data hole 94*b*, there is a line segment 22*b*, and so forth. The combination of all the line segments 22*a* through 22*h* forms the pattern of interconnection paths 18** (FIG. 4*b*), which are part of the printed circuit pattern 10.

Figures 5, 7:
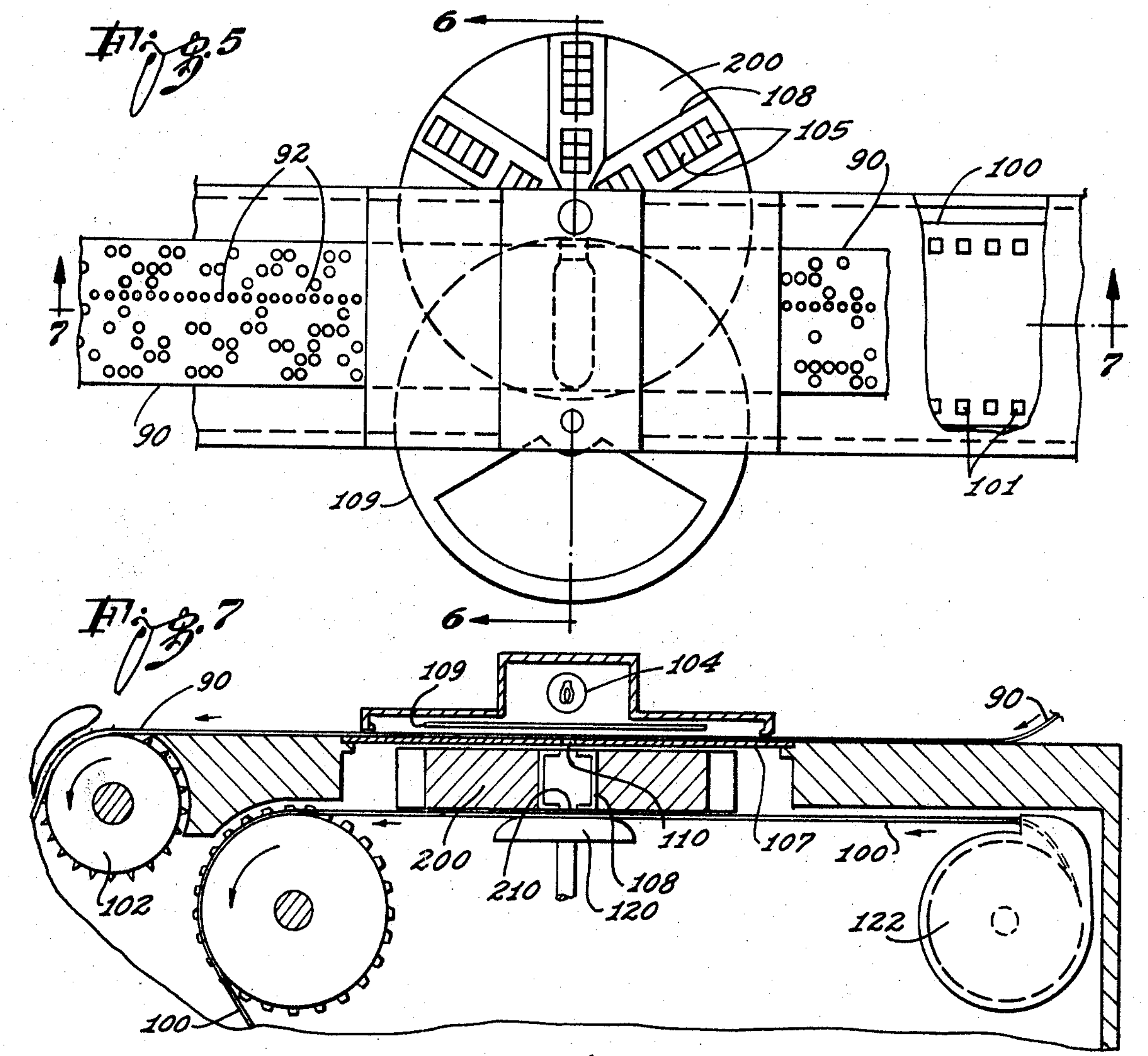
FIG. 5 is a fragmentary top plan view of an apparatus for the converting of a punched opaque control tape into a film strip containing the image of a printed circuit pattern.
FIG. 7 is a cross sectional view through the apparatus shown in FIG. 5, taken along the line 7—7 of FIG. 5.
Figure 6:
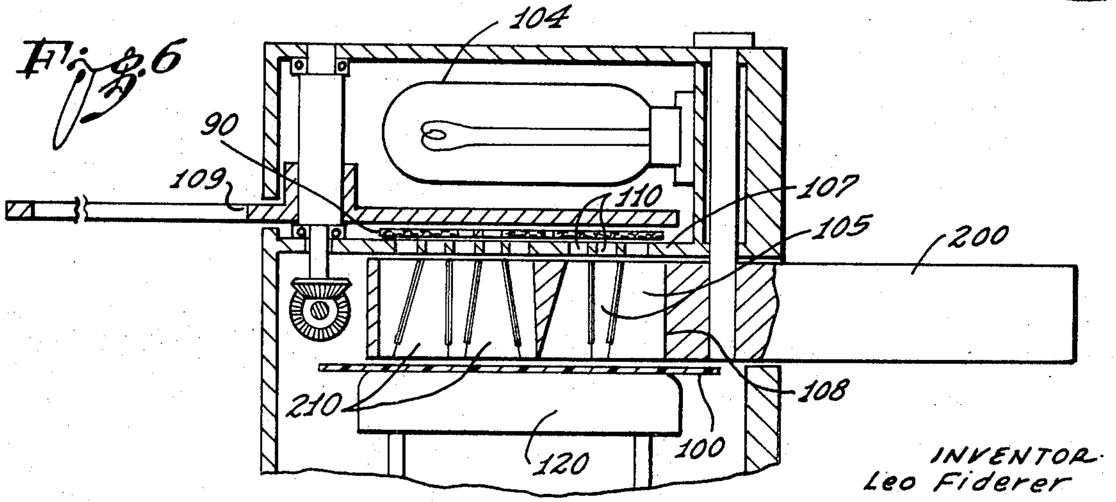
FIG. 6 is a cross sectional view through the apparatus shown in FIG. 5, taken along the line 6—6.

The apparatus for converting the data holes **94*a* through 94*h* on the punched control tape 90 into line segments 22*a* through 22*h* is illustrated in FIG. 5, FIG. 6 and FIG. 7. Referring now to FIG. 7, there is shown a sprocket wheel 102 that engages the sprocket holes 92, which are on the control tape 90. The sprocket wheel 102 advances the tape 90 past a light source 104 in steps from one sprocket hole 92 to the next. FIG. 6 shows a rotating light shutter 109 which is interposed between the light source 104 and the control tape 90 in such a manner that, when the tape 90 is momentarily at rest, light from the light source 104 is permitted to impinge upon the control tape 90. While the tape 90 is moved from one sprocket hole position to the next, the passage of light from the light source 104 to the tape 90** is blocked.

An alternate form of the present invention (not shown) omits the light shutter 109. When the light shutter 109 is omitted, the light source flashes intermittently; once at each step, in a manner similar to a stroboscopic light source.

Referring again to FIG. 7, there is a stationary aperture plate 107 positioned under the control tape 90. The aperture plate 107 contains a plurality of holes 110, one hole 110 for each of the channels of data holes 94*a* through 94*h* in the control tape. The holes 110 in the aperture plate 107 are placed in such a manner that one of the data holes 94*a* through 94*h* is lined up with one of the aperture holes 110 at each step of the tape motion.

Under the aperture plate 107 there is an optical mask 108 which is subdivided into eight compartments 105. Each compartment 105 is positioned under one of the aperture holes 110. The optical mask 108 is mounted on a turret 200, which holds several optical masks 108, each mask 108 being subdivided into a like number of compartments 105. In an alternate form of the present invention (not shown) the turret 200 is omitted and the interchangeable optical mask 108 can be inserted from the side on sliding guides.

Under the optical mask 108 there is a photosensitive film strip 100, containing sprocket holes 101. The motion of the film strip 100 can be controlled by a sprocket wheel 106. Each compartment 105 of the optical mask 108 has an opening 210 on the side facing the photosensitive film strip 100. This opening 210 has the shape of one of the elements of the printed circuit pattern 10.

The turret 200 can be indexed for different optical masks 108, each mask for a different category of elements of the printed circuit pattern 10. In the alternate form of the present invention, different optical masks 108 can be inserted and withdrawn through a slot on the side of the apparatus.

Depending on which of the optical masks 108 is positioned between the aperture plate 107 and the photosensitive film strip 100, at a given time, either segments 22*a* through 22*h* or pads 14 or 16 are created on the film strip 100.

Following is a description of the sequence of operations for the creation of the artwork of a printed circuit pattern 10 on the photosensitive film strip 100.

Referring again to FIG. 7, a light tight cartridge 122, containing the unexposed film strip 100 is inserted into the apparatus in the position shown. Then the leading edge of the film strip 100 is guided between the pressure plate 120 and the optical mask 108 onto the sprocket wheel 106, until several sprocket holes 101 are engaged by the sprocket wheel 106. Similarly, the leading end of the control tape 90 is guided between the shutter 109 and the aperture plate 107, until the sprocket holes 92 are engaged by the sprocket wheel 102. Then the light tight cover (not shown) is closed. As the light tight cover of the apparatus is closed, the pressure plate 120 pushes the photosensitive film strip 100 into close proximity to the openings 210 of the mask 108. Then the control tape 90 is advanced further to the starting position by the movement of sprocket wheel 102. Similarly, the film strip 100 is advanced a short distance further to its starting position by the movement of the sprocket wheel 106. Then the actual creation of the printed circuit pattern 10 is ready to start.

During the operation of the apparatus, the stepwise motions of the sprocket wheels 102 and 106 are synchronized. As the control tape 90 advances from one sprocket hole 92 to the next, the film strip 100 is advanced simultaneously by a distance corresponding to the spacing between two grid lines 12*b* on the strip segment 20 shown in FIG. 4*b*. Mechanisms to control the intermittent motion of tapes and film strips, such as used in punched tape readers and motion picture cameras, are well known to the art. Since such mechanisms do not form a direct part of the present invention, they are not described in detail herein.

At each step, a flash of light from the light source 104, either by the opening of the shutter 109 or by electronic control, reaches the opaque control tape 90. Wherever at a given step one of the data holes 94*a* through 94*h* is positioned over one of the aperture holes 110, the light passes through the compartment 105 and exposes an area on the film strip 100. The shape of the exposed area conforms to the shape of the opening 210 in the particular compartment under one of the data holes.

For example, the mask 108 that is assigned to the interconnection paths 18 has openings 210 facing the film strip 100, that have the shape of the line segments 22*a* through 22*h*. Adjacent line segments are made to overlap at the ends, so that a series of line segments 22*a* through 22*b* will form a continuous interconnecting path 18. In the example shown in FIG. 4*a* and FIG. 4*b*, it is evident that the absence or presence of one of the data holes 94*a* through 94*h* causes one of the line segments 22*a* through 22*h* to be projected onto the film strip 100 or to be omitted, as the case may be at each step.

Figure 4C:
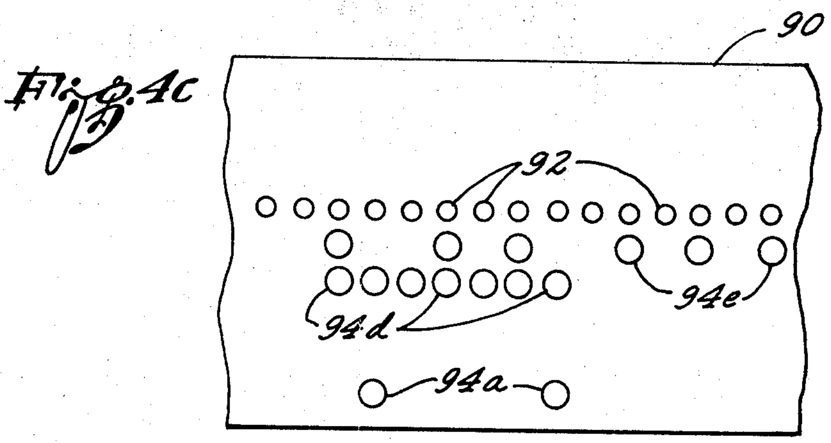
FIG. 4*c* is a fragment of an opaque punched control tape with a pattern of data holes that is a replica of a pattern of pads.

The process of projecting flashes of light onto the film strip 100 in the shape of line segments 22*a* through 22*h* is continued until the entire pattern of interconnection paths 18 is completed for the length of a strip segment 20. Then the film strip 100 is rewound to its starting position and the turret 200 is indexed for another mask 108 that contains openings 210 with different shapes. For example, a mask 108 can have openings 210 in the shape of circular pad 14 in the compartments 105 corresponding to data holes 94*a*, 94*c*, 94*e*, 94*g*; and openings 210 in the shape of rectangular pads 16 in the compartments 105 corresponding to data holes 94*b*, 94*d*, 94*f*, 94*h*. Referring now to FIG. 4*c*, there is illustrated a portion of a control tape 90, in which the data holes 94*a*, 94*e* cause the projection of an image in the shape of a circular pad 14 on the intersections of grid lines 12*a* and 12*b*, and where the data holes 94*d* cause the projection of an image in the shape of a rectangular pad 16 on the intersections of grid lines 12*a* and 12*b*.

Figure 4D:
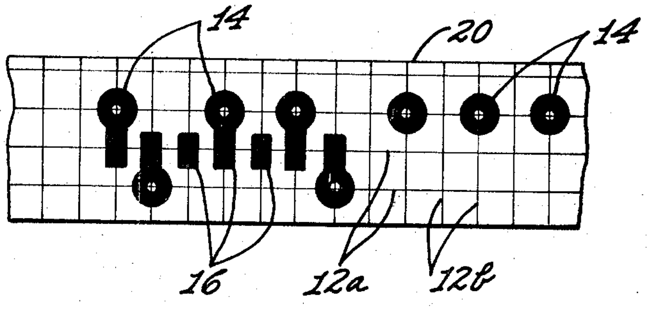
FIG. 4*d* is a strip segment with a pattern of pads that is the replica of the pattern of data holes in the punched control tape of FIG. 4*c*.

Referring now to FIG. 4*d*, there is illustrated a strip segment 20 containing pads 14 and 16 in a pattern controlled by the data holes in the control tape 90 shown in FIG. 4*c*. When the illustrations of FIGS. 4*c* and 4*d* are compared, the direct correspondence between the pads 14 and 16 and the data holes 94*a* through 94*h* becomes apparent. For each data hole 94*a* or 94*e*, there is a corresponding pad 14, for each data hole 94*d*, there is a corresponding pad 16, and so forth.

During the second pass of the film strip 100, the images of pads 14 and 16 are projected onto the film strip 100 and super-imposed over the previously exposed image of the interconnection paths 18. When the illustrations of FIG. 4*b* and FIG. 4*d* are compared, it becomes evident that when the image of FIG. 4*d* is superimposed over the image of 4*b*, the image of the circuit pattern 10 in FIG. 2 will result.

Depending on the complexity of the circuit pattern 10 and depending on the variety of the elements contained therein the pass of the film strip 100 pass the optical mask 108 is repeated as many times as necessary to complete the entire printed circuit pattern 10 for a given strip segment 20. With each pass of the film strip 100, a different optical mask 108 and a different portion of the control tape 90 is used.

It is evident that, with interchangeable masks 108, an unlimited variety of printed circuit patterns 10 can be created with the method of the present invention, using different masks 108 for interconnecting paths 18 having different line widths, or circular pads 14 having different diameters, or special pads 16 with differing shapes. However, it would be generally desirable to plan for a printed circuit pattern 10 having connecting paths 18 of uniform line width and having pads 14 of uniform diameter, so that the image of the printed circuit pattern 10 can be projected onto the film strip 100 in no more than two passes.

After the complete image of the strip segment 20 for a printed circuit pattern 10 has been projected onto the film strip 100, the film strip 100 is rewound into the light tight cartridge container 122 for subsequent development. The aforementioned process of projection is then repeated with like photosensitive film strips 100 to create portions of the printed circuit pattern 10 for successive strip segments, until the image of the entire circuit pattern 10 has been completed. The exposed film strips 100 are then developed by ordinary known photographic processes, so that the image of the printed circuit pattern 10 appears as a composite of dark areas, with the remaining areas translucent or transparent.

Figure 8:
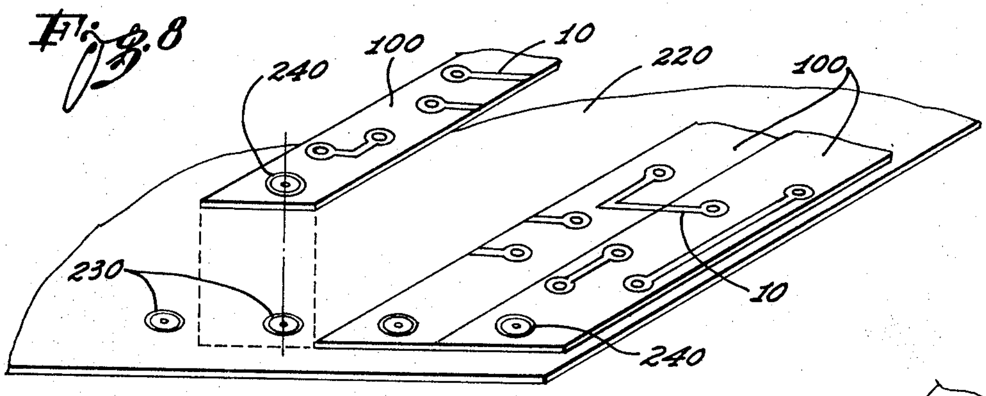
FIG. 8 illustrates the step of affixing a light sensitive film strip to a master sheet.

After development, the plurality of film strips 100, each representing a strip segment 20 of the printed circuit pattern 10, are placed on a common master sheet 220 in such a manner that the composite image of the strip segments 20, when placed side by side, forms the total image of the desired printed circuit pattern 10. The master sheet 220 contains alignment marks 230 at the location of the beginning and end of each strip segment 20 to be placed on the master sheet 220. On each film strip 100 like alignment marks 240 have been previously projected as part of the elements of the printed circuit pattern 10 in the shape of one of the line segments 22*a* through 22*h* or a circular pad 14. When all the alignment marks 240 on the film strips 100 are superimposed on the alignment marks 230 on the master sheet, as illustrated in FIG. 8, the image of the desired printed circuit pattern is formed by the composite of the images of the strip segments 20.

Figure 9:
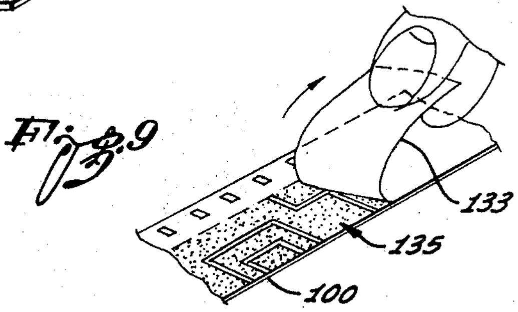
FIG. 9 illustrates the step of removing an adhesive backing from a developed light sensitive film.

The film strips 100 may be affixed to the master sheet 220 by any convenient means. One means of affixing the film strips 100 to the master sheet 230 is the use of photosensitive film strips 100 that are supplied with an adhesive backing. As illustrated in FIG. 9, the adhesive backing 133 is removed from the film strip 100 immediately prior to the placement of the film strip 100 on the master sheet 220. When the adhesive backing is removed, an adhesive surface 135 remains on the surface of the photosensitive film 100. With the adhesive surface 135 facing the master sheet, the alignment marks 240 on the film strip 100 are aligned with the marks 230 on the master sheet 220, and the film strip 100 is firmly adhered to the master sheet 220.

Figure 11:
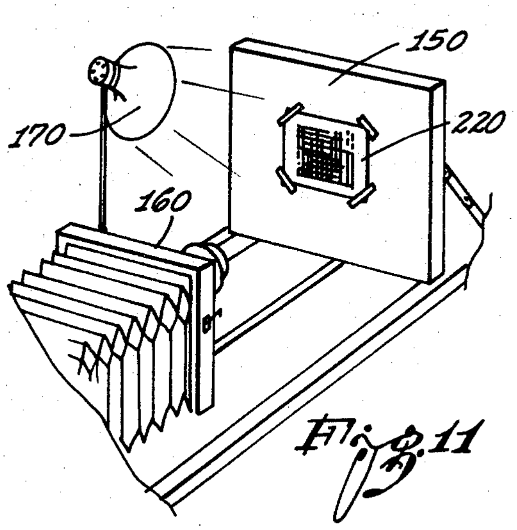
FIG. 11 is a perspective view of a setup for producing a printed circuit photomaster from a master sheet with affixed film strips obtained by the methods illustrated in FIGS. 8, 9 and 10.

After all the developed film strips have been properly placed on the master sheet 220, the master sheet 220 can be affixed to a backing 150 and photographed with a camera 160 while being exposed to a light 170, as shown in FIG. 11. The negative of the photograph, either on a stable film or a glass plate, obtained by the method illustrated in FIG. 11, can be used as the photomaster for the fabrication of a printed circuit.

Consequently, it has been shown that a photomaster for a printed circuit can be made by the present invention without the need for a photo plotter or any other type of plotter. The apparatus used by the present invention is much less complex and therefore less expensive than a photo plotter. Furthermore, the present invention does not require the installation of special environmental facilities, it uses a compact device that can be easily transported by hand and operated in any convenient location, a device that does not require the complex controlling circuitry of a photo plotter, a device that can translate information from a perforated numerical control tape into a photomaster for printed circuits without the requirement of a computer and the associated computer peripheral equipment. Consequently, the method of operation of the present invention is less costly than the operation of a photo plotter.

In addition to the form of operation already described herein, the present invention can be used in a variety of ways that extend the usefulness of the present invention and increase its versatility.

Whenever a large number of printed circuit boards has to be fabricated that form parts of a system of related circuitry, the cost of producing the photomasters for said printed circuit boards can be reduced by the present invention to an extent above and beyond the one aforementioned. When such a plurality of related printed circuit boards is required, the photomaster for a common master pad sheet can be prepared first.

Figure 10:
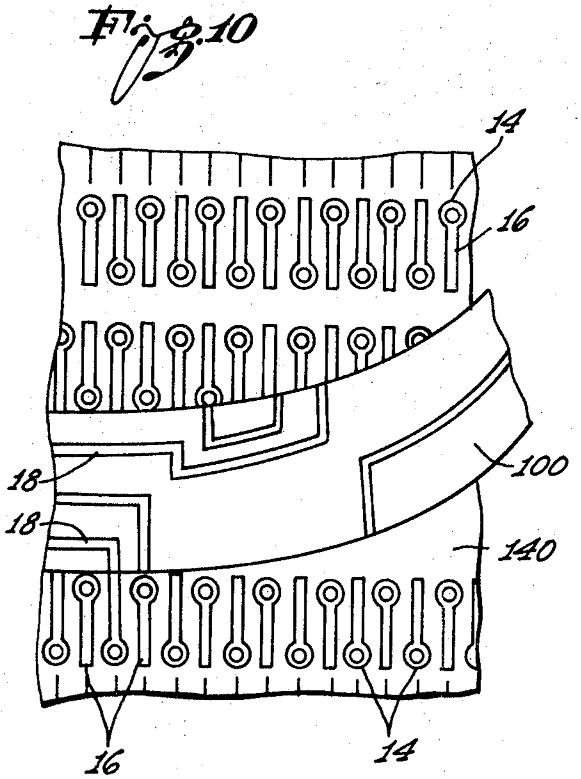
FIG. 10 is a fragmentary plan view of a pad master sheet and includes a step of developed photosensitive film being applied to the pad master sheet.

Referring now to the illustration of FIG. 10, there is illustrated a fragmentary view of a master pad sheet 140. Such a master pad sheet 140 contains the markings for the common outline of said related printed circuit boards, and a plurality of markings of pads 14 or 16 or a combination thereof in an ordered array, to indicate the common placement of printed circuit connectors (not shown) and the common set of locations for possible component placement on pads 14 or 16.

The photomaster for the master pad sheet 140 can be produced by the methods already described herein, except that the pattern of the interconnecting paths 18 is omitted from the photomaster for the master pad sheet 140. This photomaster for the pad sheet 140 can be economically and accurately duplicated by common photographic processes in quantities dictated by the quantities of related printed circuit boards that are part of a common system.

To complete the printed circuit pattern 10 for each individual circuit board, film strips 100 that contain the pattern of interconnecting paths 18 are superimposed over the pattern of pads 14 and 16 on the master pad sheet 140, as shown in FIG. 10. With this method, each film strip 100 has to be processed under the optical mask 108 only once, for the creation of the pattern of interconnecting paths 18, since the markings for pads 14 and 16 are already present on the master pad sheet 140. After all the film strips 100 have been affixed to the master pad sheet 140 by the methods already described in conjunction with the master sheet 220, the photomaster for the printed circuit board is created by the procedure illustrated in FIG. 11.

With the method of the present invention, it is not necessary to have all the grid lines 12*a*, which run parallel to the direction of the length of the strip segment 20, uniformly spaced. It is only required that in a given printed circuit pattern 10 the grid lines 12*a*, parallel to the length of the strip segments 20, appear in a sequence of spacings repeated for each strip segment 20 and that the grid lines 12*b*, perpendicular to the length of the strip segments 20, are spaced at uniform increments. For example, referring now to FIG. 3*b*, with the present invention it is also possible to have a pattern of grid lines 12*a* and 12*b* as shown in FIG. 3*b* which is repeated in each parallel strip segment and where the line segments 22*a* through 22*h*, controlled by data holes 94*a* through 94*h*, are arranged as shown in FIG. 3*b*.

An alternate form of the present invention is especially useful for the creation of printed circuit patterns 10 with a variety of elements requiring the use of more than two different optical masks 108. In this alternate form of the present invention, the indexing motion of the rotating turret 200, holding a plurality of optical masks 108, is linked to the stepped motion of the opaque punched control tape 90 and the photosensitive film strip 100. With a control indexing motion of the turret 200, the turret is indexed from one optical mask 108 to the next, while the punched control tape 90 is advanced from one sprocket hole position to the next .The photosensitive film strip 100 remains stationary at a given position of grid line **12*b* until the turret 200 has completed one revolution and all the masks 108 have passed the grid position. After the turret 200 has made one complete revolutoin and has been indexed for all the available masks, the film strip 100 is advanced to the position of the next grid line 12*b*, and the turret 200 renews the sequence of passing the masks 108 over the film strip 100, whereby a different set of data holes 94*a* through 94*h* in the control tape 90** is positioned over each mask.

The alternate form of the present invention, described in the preceding paragraph, requires a mechanism (not shown) that links the motion of the sprocket wheel 106, driving the film strip 100, to the motion of the revolving turret 200, in a manner causing the film strip 100 to be advanced by one grid position after the turret 200 has completed one revolution. Another mechanism (not shown) causes the sprocket wheel 102 to advance the control tape 90 from one sprocket hole 92 to the next each time the turret 200 is indexed from one optical mask 108 to the next. Mechanisms linking the intermittent rotary motion of different wheels are well known and are therefore not described in detail herein. With a controlled indexing motion of the turret 200, only one pass of the film strip 100 is required to create the printed circuit pattern 10 for a given strip segment 20.

Furthermore, the present invention is not restricted to control tapes 90 having eight data hole channels. It is evident that a perforated control tape 90 with any convenient number of data hole channels can be used with the present invention, each data hole channel controlling a particular shape of an element of a printed circuit pattern 10 to be selectively applied in successive steps.

A punched control tape 90 with eight data hole channels, although not the only type of control tape that can be used with the present invention, can be more easily procured with the aid of known eqiupment in common present usage than a control tape 90 with a different number of data hole channels. Devices to perforate and to interpret numerical control tapes with each data hole channels are in common use in conjunction with computers and a variety of automatic machines. Since the construction of such devices does not form a direct part of the present invention and is well known, the construction of these devices is not described in detail herein.

There is a variety of methods available to obtain a perforated control tape 90 with eight data hole channels for use in the present invention, utilizing existing known devices. Some of these methods, although not part of the present invention per se, are described herein to the extent required to illustrate the versatility of the present invention and its ability to be used in conjunction with a plurality of other steps which are part of the design process for printed circuit boards.

One method of obtaining a control tape 90 with eight data hole channels is the use of a computer program for component placement and conductor path routing.

Before the configuration of a printed circuit pattern is decided upon, considerable effort is required for the planning and the layout of the placement of the components on the printed circuit board and the routing of the conductor paths. The time required for this effort is usually much more than the time required for the actual creation of the art work by manual methods. To reduce the time and effort required for the planning and layout phase of the printed circuit design, computer programs have been written which accept information about circuit schematic diagrams and circuit board outlines in coded form and which then decide upon the optimum placement of components and the routing of conductor paths on a printed circuit board. Usually such programs furnish printed parts lists, numerical control tapes for automatic drilling machines, and so forth. Such a computer program can also be instructed to furnish a punched control tape 90, such as illustrated in FIG. 4*a* and FIG. 4*c*, to be produced on standard tape punching equipment. With the present invention, unlike the case with photo plotters or automatic drafting machines, once the control tape 90 has been procured, further use of a computer with its peripheral equipment is not required any more. This feature permits a more economical use of a computer with the present invention than with other automatic equipment.

Another method of obtaining a control tape 90 is the use of a digitizer such as the one described herein under the description of prior art. In order to produce a control tape 90 for use with the present invention, the operator of the digitizer scans the traces of conductor paths and pads on a grid layout for one strip segment 20 at a time, one after another. The information about the scanned traces is processed by a computer and furnished as an output in the form of a control tape 90, such as illustrated in FIG. 4*a* and FIG. 4*c*.

A third method of obtaining a control tape 90 does not involve the use of any computer. With this method, a tape punching mechanism is electrically or mechanically linked to a keyboard or pushbutton control panel. The blank tape is advanced in the tape punching mechanism in steps from one sprocket hole 92 to the next. The operator at the keyboard or the control panel determines which of the data holes **94*a* through 94*h* are to be punched in the tape 90** at each step. This method is somewhat slower than the use of a digitizer, but it requires equipment that is much less expensive than a digitizer and does not require a computer.

Another method of obtaining a control tape 90 for use with the present invention is the use of a tape punching mechanism that is electrically linked to a photoelectric scanning device. This method, like the method mentioned in the preceding paragraph does not involve the use of a computer. With this method, the layout of the interconnecting paths is sketched on a strip of gridded paper and passed through a photoelectric scanning device. The sketched line segments are detected by the photoelectric scanning device. A control tape 90 such as shown in FIG. 4*a* is produced by the signals from the scanning device. Similarly, a sketch of the location of pads 14 or 16 on a strip of gridded paper can produce a control tape 90 such as shown in FIG. 4*c* for the creation of pads 14 or 16 on the printed circuit pattern 10.

It has been shown that the present invention can reduce the cost of creating the artwork for a printed circuit photomaster in a wide variety of applications, with complex and simple printed circuit pattern, with and without the aid of a computer program, with printed circuit patterns that are unique and with a plurality of printed circuit patterns that have common features. In all the aforementioned applications, an accurate printed circuit photomaster can be produced with substantially less expensive equipment than used with prior automatic methods, at a less expensive rate than prior automatic methods, and at a substantially quicker rate than prior manual methods.

While the salient features and advantages of the present invention have been illustrated and described, it should be readily apparent that modifications can be made within the spirit and scope of the present invention. It is intended to cover all such modifications in the following claims.

I claim:

1. A method of making accurate representations of printed circuit patterns for the production of photomasters for printed circuit boards, providing an opaque punched tape containing a pattern of holes related to a corresponding pattern of printed circuit elements, providing a light source and an aperture plate having a set of holes therein, advancing the opaque punched tape past the light source and the set of holes in the aperture plate at a particular rate of intermittent motion, the light source being disposed on the first side of said opaque punched tape, the aperture plate being disposed on the second side of said opaque punched tape, controlling the intermittent motion of said opaque punched tape in a manner that causes one or more of the holes in the punched tape to be aligned with the holes in the aperture plate at each instant the tape is momentarily at rest, disposing an optical mask on the side of the aperture plate opposite the side of the opaque punched tape, said mask having compartments corresponding to the number of holes in the aperture plate, each compartment being separated from its adjacent compartment by a light barrier preventing light from one compartment to penetrate into its adjacent compartment, providing each compartment in said optical mask with a translucent area on the side opposite the side of the aperture plate, such translucent area having the shape of a particular element of a printed circuit pattern, advancing a light sensitive film in intermittent motion past said optical mask on the side of the translucent areas having the shape of elements of a printed circuit pattern, the intermittent motion of the light sensitive film being linked to the motion of the opaque punched tape in a manner that causes the film to be momentarily at rest at each instant the opaque punched tape is momentarily at rest, and whereby each increment of film advance corresponds to the spacing between two adjacent parallel grid lines of the printed circuit pattern, causing one or more beams of light from the light source to impinge on the opaque punched tape at each instant the punched tape is momentarily at rest, permitting said beams of light to pass through one or more of the holes in the punched tape, through the corresponding holes in the aperture plate, through the corresponding compartments in the optical mask, and through the corresponding translucent areas facing the light sensitive film, and permitting said beams to impinge on the light sensitive film, exposing areas on the light sensitive film, said areas having the shape of the translucent areas on the side of the optical mask facing the light sensitive film.

2. The method set forth in claim 1, wherein the step of converting the pattern of holes on the opaque punched tape into markings on a film representing a printed circuit pattern includes the steps of:

selectively exposing areas, in the shape of particular printed circuit elements corresponding to a particular optical mask, on the light sensitive film in successive steps of film advancement for the length of a given film strip needed to represent a given printed circuit pattern, rewinding the film to its starting position and exchanging one optical mask for another optical mask containing translucent areas on the side facing the light sensitive film in the shape of different printed circuit elements, repeating the process of selectively exposing areas on the light sensitive film in successive steps superimposing newly exposed areas over previously exposed areas, until the composite of all the exposed areas on the light sensitive film represents the desired representation of the printed circuit pattern.

3. The method set forth in claim 1, wherein the step of converting the pattern of holes in the opaque punched tape into markings on a film representing a printed circuit pattern includes the steps of:

exposing areas, in the shape of particular printed circuit elements corresponding to the particular mask, on the light sensitive film, exchanging one optical mask for another optical mask, said other mask containing translucent areas on the side facing the light sensitive film in the shape of other printed circuit elements, during the motion of the opaque punched tape from one position of momentary rest to its next position of momentary rest, while the light sensitive film is held stationary.

exposing areas on the light sensitive film in the shape of printed circuit elements corresponding to the newly selected mask, whereby the newly exposed areas are superimposed over the previously exposed areas, repeating the process of changing from one optical mask to another optical mask for a given sequence of masks in a cycle, each mask causing the shapes of different types of printed circuit elements to be exposed in the light sensitive film, while the film is being held stationary during a particular cycle of optical mask changes, advancing the light sensitive film from one grid position to the next grid position after the completion of a cycle of optical mask changes, and repeating the process of successive exposure of areas in the shape of printed circuit elements for another cycle of optical mask changes at the new grid position of the light sensitive film, repeating the process of successive exposure of areas on the light sensitive film, whereby the film is being held stationary during each cycle of mask changes and is advanced from one grid position to the next at the completion of each cycle of mask changes, until the composite of all the exposed areas on the light sensitive film represents the image of the desired printed circuit pattern.

4. The method set forth in claim 1, wherein the step of producing a photomaser for a printed circuit board includes the step of:

developing a plurality of photosensitive film segments, said film segments having been exposed, whereby the developed film segments exhibit opaque areas in the shape of segments of the desired printed circuit pattern, providing alignment marks on the developed film segments and on a common backing material to facilitate the assembly of the developed film segments onto the common backing, to produce a composite image representing the desired printed circuit pattern, assembling said developed film segments on a common backing in a manner corresponding to the arrangement of the segment of the desired printed circuit pattern, to produce the totality of the desired circuit pattern, making a photomaster for the printed circuit board by obtaining a photograph of the composite of assembled film segments and developing said photograph.

5. The method set forth in claim 1, wherein the step of producing photomasters for a plurality of printed circuit boards that have particular elements of a printed circuit pattern in common includes the step of:

preparing a photomaster for the elements of the printed circuit pattern, such as circular or rectangular pads or the like, that are common to the plurality of printed circuit boards, wherein the common photomaster consists of a translucent sheet containing opaque markings in the shape of circular or specially shaped pads arranged in ordered arrays, duplicating said common photomaster by known photographic processes in the quantity required by the plurality of printed circuit boards with common elements of a printed circuit pattern, preparing exposed film segments containing circuit elements that are unique to each of aforesaid printed circuit boards, such as interconnection paths and the like, and providing alignment marks on each of said film segments, producing a unique photomaster for each of said printed circuit boards by assembling the exposed film segments containing the distinct elements of the printed circuit pattern of each particular printed circuit board, onto the sheet representing the common elements of the printed circuit pattern, superimposing the distinct elements over the common elements of the printed circuit pattern, whereby the composite of the film segments assembled onto the common sheet yields the image of the desired printed circuit pattern for a particular board, making a photomaster for each unique printed circuit board by obtaining a photograph of the composite of the film segments assembled on the common sheet and developing said photograph.

References Cited

UNITED STATES PATENTS

| | | | |
|---|---|---|---|
| 3,597,629 | 12/1970 | Kinney et al. | 96—27 |
| 3,508,919 | 4/1970 | Reimer | 96—27 |

J. TRAVIS BROWN, Primary Examiner

E. C. KIMLIN, Assistant Examiner

U.S. Cl. X.R.

96—27, 45